United States Patent [19]

Pfiester

[11] Patent Number: 5,166,084
[45] Date of Patent: Nov. 24, 1992

[54] PROCESS FOR FABRICATING A SILICON ON INSULATOR FIELD EFFECT TRANSISTOR

[75] Inventor: James R. Pfiester, Austin, Tex.

[73] Assignee: Motorola, Inc., Schaumburg, Ill.

[21] Appl. No.: 753,512

[22] Filed: Sep. 3, 1991

[51] Int. Cl.[5] .......................................... H01L 21/265
[52] U.S. Cl. ...................................... 437/40; 437/44; 437/29; 437/234; 437/913; 437/131; 148/DIG. 150
[58] Field of Search ........................ 437/40, 28, 29, 21, 437/22, 27, 233, 234, 913, 84, 131, 132; 148/DIG. 53, DIG. 150, DIG. 58, DIG. 59; 357/23.7

[56] References Cited

U.S. PATENT DOCUMENTS

| | | | |
|---|---|---|---|
| 4,396,930 | 8/1983 | Mizutani | 357/23.7 |
| 4,769,338 | 9/1988 | Ovshinsky et al. | 437/109 |
| 4,849,371 | 7/1989 | Hansen et al. | 437/131 |
| 4,888,629 | 12/1989 | Harada et al. | 357/23.7 |
| 4,907,053 | 3/1990 | Ohmi | 357/23.7 |
| 5,047,360 | 9/1991 | Nicholas | 437/40 |
| 5,082,794 | 1/1992 | Pfiester et al. | 437/40 |

OTHER PUBLICATIONS

IBM Tech. Disclosure Bulletin; vol. 11, No. 9, Feb. 1990; Inverted Thin Film Transistor; Fowler and Walker; p. 1137.

"Selective Etching of SiGe on SiGe/Si Heterostructures," by G. K. Change et al., Journal of the Electrochemical Society, vol. 138, No. 1, Jan. 1991, pp. 202-204.

Primary Examiner—Brian E. Hearn
Assistant Examiner—Michael Trinh
Attorney, Agent, or Firm—Robert L. King

[57] ABSTRACT

A process for fabricating an isolated silicon on insulator (SOI) field effect transistor (FET) (10, 11, 13, 15). The SOI FET is made on a substrate material (12). In one form, a first control electrode referred to as gate (24), is contained within the substrate (12) underlying a dielectric layer (14). A second control electrode referred to as gate (26) overlies a dielectric layer (28). A source and a drain current electrode are formed from a germanium-silicon layer (18). A silicon layer (16) forms an isolated channel region of the SOI FET. The gates (12, 24) are separated from the channel by gate dielectric layers (14, 28). The germanium-silicon layer (18) is much thicker than the silicon layer (16) which is made thin to provide a thin channel region. An optional nitride layer 20 overlies the germanium-silicon layer (18).

10 Claims, 2 Drawing Sheets

PROCESS FOR FABRICATING A SILICON ON INSULATOR FIELD EFFECT TRANSISTOR

FIELD OF THE INVENTION

The present invention relates generally to semiconductors, and more particularly, to silicon on insulator (SOI) field effect transistors (FETs).

BACKGROUND OF THE INVENTION

From the beginning of the integrated circuit industry, the need for resistive devices and load resistors to operate as resistive pull-up devices has existed. A resistive pull-up device is a device connected to a main power supply of a transistor circuit and is needed to achieve high and low logic voltage levels. The early needs for a resistive pull-up device where satisfied by semiconductor resistive lines such as doped substrate-contained resistors and was improved upon much later in time by polysilicon resistor layers. The devices resulting from polysilicon and silicon loads were widely used but had several disadvantages, such as: (1) a large surface area and therefore poor circuit density; (2) a large amount of power consumption; (3) slow speed of operation; (4) a high occurrence of manufacturing-related inconsistencies and variation between die to die and wafer to wafer; (5) the inability to attain the consistently decreasing new dimensions required for performance improveme. :s; and (6) higher leakage currents and other limitations.

To improve upon performance and circuit density the industry began to research and adopt active load pull-ups which are gate biased thin-film transistors (TFTs) that act as voltage variable resistors. These gate biased TFTs provided several advantages: (1) a more power efficient replacement for resistive pull-ups, which was observed in the active load pull-up configuration in conventional complementary metal oxide semiconductor (CMOS) technology; (2) faster operational speed; (3) increased circuit density; and (4) submicron dimensional capability. As technology progressed, the TFTs used as pull-up structures developed the following limitations: (1) isolation problems such as the widely observed and understood latch-up phenomena; (2) increased leakage currents; (3) short channel behavior such as drain induced barrier lowering (DIBL) which adversely affects threshold voltages; (4) size reduction limitations; and (5) larger resistive losses. It was becoming apparent that a new technology was needed to further reduce structures beyond the conventional submicron sizes and to achieve higher levels of performance.

To achieve the new levels of performance that were needed primarily by dynamic random access memory (DRAM) devices and fast static random access memory (FSRAM) devices, the industry began to research silicon on insulator (SOI) technology. Most successful SOI technology involves the growth or deposition of a thin region of semiconductor material, such as silicon, used as an FET channel. This channel is contained by dielectrics on perimeters requiring isolation and is placed adjacent to a source region and a drain region, which is usually another conductive or semiconductive material to allow FET current flow and device operation.

One known SOI structure and process uses a substrate which comprises a gate dielectric overlying the substrate and a gate electrode contained within the substrate underlying the gate dielectric. A polysilicon layer is formed on the gate dielectric and doped to a predetermined first conductivity. A portion of the polysilicon layer overlying the gate electrode is oxidized which consumes the polysilicon over the gate electrode to a smaller thickness while keeping the surrounding polysilicon thicker. This smaller thickness now forms a transistor channel region where current will flow when the device assumes an "on" state. The thicker polysilicon surrounding the now thinner channel polysilicon region is then counterdoped to a conductivity opposite of the channel polysilicon region, thereby forming a source and a drain.

This known SOI structure helped to improve isolation and provide benefits over active pull-up resistor structures, but the structure had a few disadvantages as well. One disadvantage is that the source, drain, and channel region are formed from the same layer of polysilicon material and this layer is exposed to many changes in doping from implants, diffusions, or other methods. These methods of doping can cause an exchange or flow of dopant charge between the source and the channel, and the drain and the channel during subsequent processing steps that can produce undesirable and unpredictable shifts in device performance. The process used to form the channel region in the described SOI structure creates inconsistent channel thicknesses because oxidation resulting in silicon consumption, which is typically hard to repeat consistently, is relied on for channel formation. The channel thickness variation from die to die and wafer to wafer can cause unacceptable device performance variation. Polysilicon is also not a desirable material to choose for the source and drains due to the high temperature processing which polysilicon requires to activate electrical charge and due to other known limitations.

Several other SOI technologies having some improvements were proposed. A known and improved SOI structure comprised an SOI FET with a thicker channel region and thin source drain regions. Other research involved devices where the channel and gate were defined and etched in separate steps from the source and drain formation and usually required epitaxial growth of materials. These processes did improve performance in several areas but they still had a few disadvantages, for instance: (1) large series resistive losses; or (2) the need for high temperature processing; or (3) charge transfer phenomena that changed device performance; or (4) the processing limitations of polysilicon; or (5) poor contact metallurgy compatibility. It is therefore apparent that a process is needed to overcome these disadvantages.

SUMMARY OF THE INVENTION

The previously mentioned needs are fulfilled and other advantages achieved with the present invention, in which a process is used to form an isolated SOI FET. In one form, the present invention comprises a substrate material with a first dielectric layer formed overlying the substrate. A silicon layer of a first conductivity type is formed overlying the first dielectric layer. A germanium-silicon layer thicker than the silicon layer is formed overlying the silicon layer. A portion of the germanium-silicon layer is selectively etched away forming an opening in this layer with a walled surface which exposes a portion of the underlying silicon layer. This exposed portion of the silicon layer forms a transistor channel region and the unetched portions of the germanium-silicon layer form the current electrodes.

The present invention will be understood by one skilled in the art from the detailed description below in conjuction with the accompanying drawings.

DESCRIPTION OF THE PREFERRED EMBODIMENT

As stated previously, the need exists for a process that can provide a resistive pull-up device with the advantages of: (1) isolation; (2) reduced dopant charge and impurity transfer between channel regions and a source and drain; (3) low temperature fabrication; (4) reduced resistive losses; (5) more repeatable manufacturing; (6) good support for contact metallurgy; and (7) reduction in unwanted short channel effects.

Figure 1A:
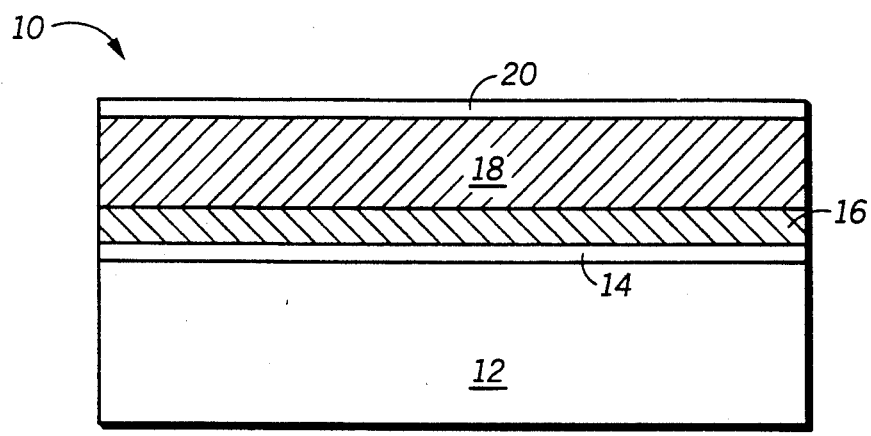
FIGS. 1A-1C illustrate, in cross-sectional form, a semiconductor device fabrication process for forming a SOI FET in accordance with the present invention.
Figure 1B:
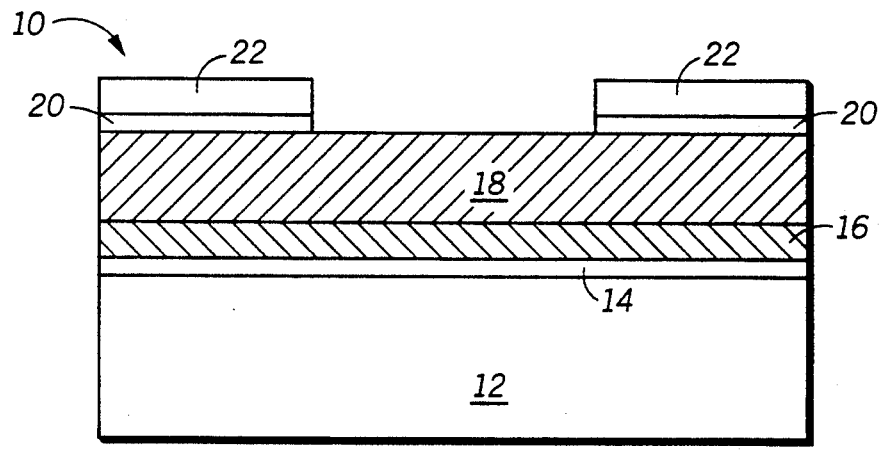
Figure 1C:
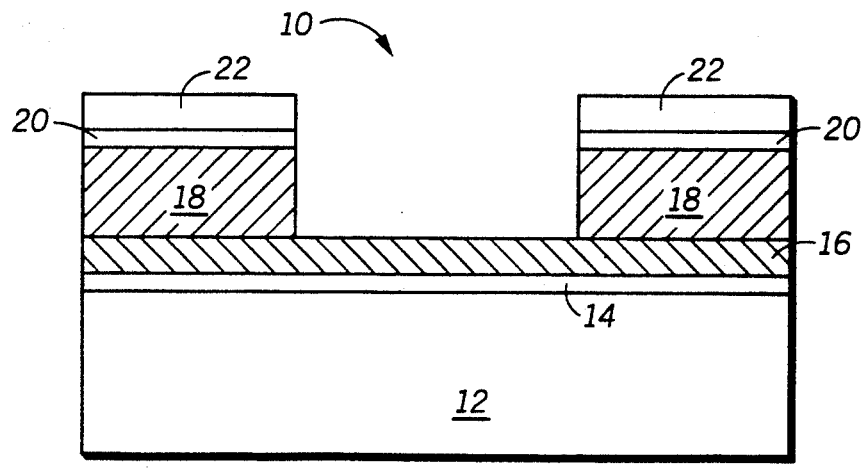

Illustrated in FIGS. 1A-1C are cross-sectional diagrams which sequentially depict a process for forming a silicon on insulator (SOI) field effect transistor (FET) in accordance with the present invention. FIGS. 1A-1C illustrate a device 10 having all of the previously mentioned advantages. Device 10, in FIG. 1A, has a substrate 12, usually made of silicon but not limited to silicon, and an overlying dielectric layer 14. Dielectric layer 14 can be formed through one of several techniques, for example, growth or deposition. A substrate compatible layer doped to a predetermined density, in this case silicon layer 16, is formed overlying the dielectric layer 14. Silicon layer 16 will be used later in the process to form the SOI FET's channel region, which is a length of semiconductor material that separates a source current electrode and a drain current electrode. A germanium-silicon layer 18 is formed overlying the silicon layer 16 and the germanium-silicon layer 18 will be used to form source and drain regions. The germanium-silicon layer 18 is made thicker than the underlying silicon layer 16 and in order to be selectively removed properly will hold a 20%-60% concentration of germanium for most applications. The germanium-silicon layer 18 may be doped with the appropriate source and drain impurity dopant atoms either in-situ, where impurities are introduced into a material during formation, or after formation with ion implantation or diffusion techniques. An optical nitride layer 20 is illustrated in FIG. 1A and is deposited for several reasons: (1) to act as a safety hard mask for the germanium-silicon etch step which tends to consume large amounts of photoresist; and/or (2) to help protect the underlying source and drain regions from implants; and/or (3) to add an extra dielectric layer between the subsequently formed source and drain and overlying regions to help reduce capacitive coupling such as Miller Capacitance. As stated previously, the nitride layer 20 is optional and may or may not be formed depending on the application and specific details of the manufacturing process.

If the optional nitride layer 20 is formed, FIG. 1B illustrates a nitride removal step of a portion of nitride layer 20 on the germanium-silicon layer 18. To remove only a predetermined area of the nitride, a masking layer 22, usually photoresist, is formed over the nitride layer 20, usually through a conventional spin and bake procedure. A channel size region is exposed into the masking layer 22 through known photolithographic techniques and developed to form an opening in the masking layer 22. Conventional wet or dry etch technology can then be used to open the same channel size opening in the nitride layer 20.

FIG. 1C depicts a germanium-silicon removal step for device 10. The masking layer 22 and the nitride layer 20 are used to dimension the channel size opening in the germanium-silicon layer 18. To accomplish the germanium-silicon etch, a wet etch solution comprising HF, $H_2O_2$ and $CH_3COOH$ respectively in a (1:2:3) ratio is used. It is important to note at this point that other newly discovered dry etches can also accomplish the germanium-silicon etch step. The previously mentioned wet etch step, outlined in a paper by G. K. Chang et. al., entitled "Selective Etching of SiGe on SiGe/Si Heterostructures", University of California, Jan., 1991, The Electrochemical Society Inc., Vol. 138, No. 1, Page 202 etches germanium-silicon (SiGe) with an extremely high degree of selectively to exposed or underlying silicon layers. Therefore, the germanium-silicon layer not covered by the masking layer 22 or the nitride layer 20 are removed to create a mechanically and electrically unharmed exposed part of the silicon layer 16 which will become a channel region of the FET. The two remaining and disconnected regions of germanium-silicon layer 18, which are formed from the germanium-silicon layer 18 etch, become the current electrodes or respectively the source and the drain of the FET. The channel region and the source and the drain are formed from relatively stable and repeatable techniques such as growth, deposition, and highly selective etch processing, therefore their physical dimensions and especially their thicknesses are very repeatable and consistent. After the germanium-silicon etch step the masking layer 22 is removed.

Figure 2:
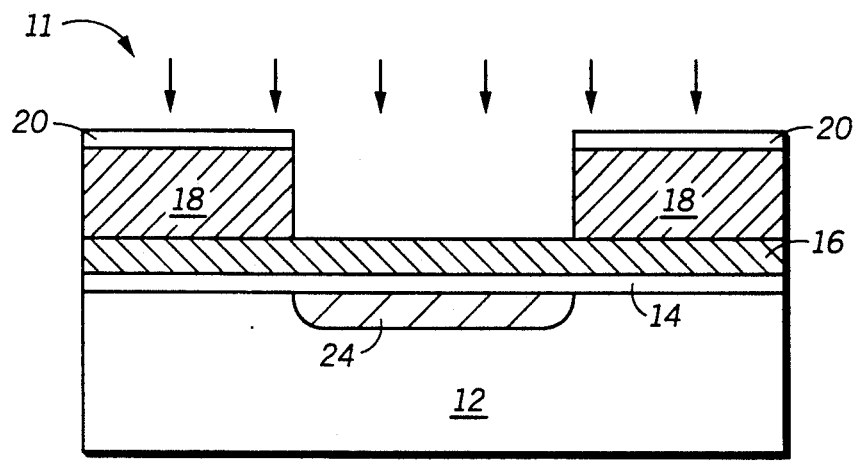
FIG. 2 illustrates, in cross-sectional form, a SOI FET with a substrate contained gate region formed by a process in accordance with the present invention.

FIG. 2 illustrates how device 10 of FIGS. 1A-1C can be implanted to form device 11 which is a SOI FET with a self-aligning substrate-contained gate 24 in accordance with the present invention. As an alternative, the source and drain areas may be doped with a gate implantation step instead of doping prior to the germanium-silicon patterning and etch step. The gate 24 can be electrically doped different from other conductive and semiconductive regions of device 10 with conventional techniques. The channel size opening in both the nitride layer 20 and the germanium-silicon layer 18 provide a path that permits substrate implanting to form gate 24 within the substrate 12. The gate 24 directly underlies the dielectric layer 14 and therefore dielectric layer 14 now acts as a gate dielectric for the FET. The gate 24 is usually implanted with an impurity that counter-dopes the substrate from P-type to N-type or from N-type to P-type. At this point in the process flow, a complete SOI FET has been formed which includes, in general: a source formed from germanium-silicon layer 18, a drain formed from germanium-silicon layer 18, a gate 24, an isolated channel formed by the silicon layer 16 that overlies the gate 24, and a gate dielectric 14.

Figure 3:
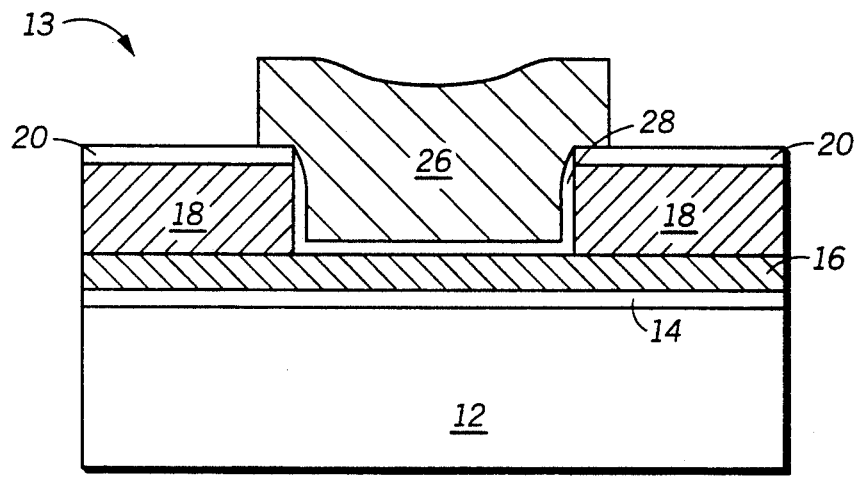
FIG. 3 illustrates, in cross-sectional form, a SOI FET with an overlying gate region formed by a process in accordance with the present invention.

FIG. 3 depicts an alternative gate formation from that illustrated in FIG. 2. Device 11 of FIG. 2 has a substrate contained gate whereas device 13 of FIG. 3 has an overlying gate structure. To form this structure a dielectric layer 28 is formed overlying the exposed silicon layer 14 channel region of FIG. 1C and on the sidewalls of both the opening in the germanium-silicon layer 18 and the optional nitride layer 20, if that optional layer is present. The dielectric layer 28 functions as a gate dieletric for device 13 and protect the gate from electrical short-circuits to underlying areas. A conductive or semiconductive gate 26 is then formed overlying the dielectric layer 28 overlapping the germanium-silicon layers 18 and the nitride layer 20 by a predetermined distance. The gate 26 can be electrically doped different from other conductive and semiconductive regions of device 13 with conventional techniques.

Gate 26 of FIG. 3 and gate 24 of FIG. 2 are not only different in location but also differ in physical compositon. Gate 26 can be doped or undoped polysilicon, metal, or a metal-containing compound formed in many ways whereas the gate 24 is an implanted substrate. Due to the fact that these gates are physically different material and located in a different physical space, their electrical and mechanical properties also differ. In addition, the dielectric layers 28 and 14 which serve as gate dielectrics and are usually oxides may not have the same dimensions, such as thickness. The dielectric layers 28 and 14 may not be formed identically or may be formed from different techniques such as growth or deposition. The dielectric layers 28 and 14 can also be made of different materials. Therefore, there are advantages to having the flexibility of a two-gate structure formed by combining the gate structures of device 11 and device 13.

Figure 4:
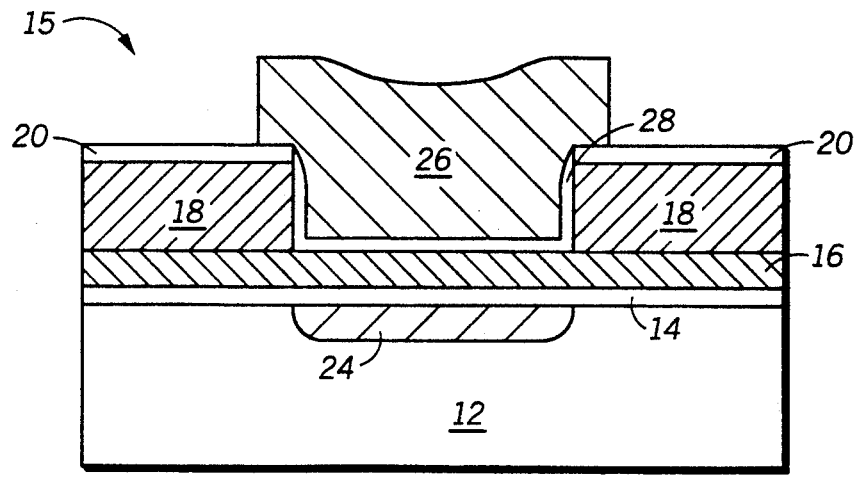
FIG. 4 illustrates, in cross-sectional form, a SOI FET also formed by the process of the present invention.

FIG. 4 illustrates an alternative SOI FET device 15 that could result from the combining of the gate structures of device 11 and device 13 in accordance with the present invention. First, a gate 24, similar to or identical to gate 24 of device 11 is formed. After the gate 24 has been formed as outlined previously, the process steps for producing gate 26 of device 13 can be performed. The resulting device 15 has an underlying substrate-contained gate 24 and an overlying gate 28 with both dielectric layers 28 and 14 acting as gate dielectric layers for device 15. This device has all the advantages mentioned for devices 11 and 13 with an added functional advantage of being able to act as a logical OR gate or a logical NOR gate as well. Due to the fact that device 15 has two gates, gate 24 or gate 26 can invert the channel region which makes the channel conductive and therefore device 15 on. Therefore, device 15 can provide logical OR functions or logical NOR functions without the conventional use of two separate transistors in parallel. By using only one channel region to produce the logical OR function or logical NOR function device 15 reduces circuit surface area and increases circuit density. The use of two gates can also give the inventive SOI FET device the advantage of having a series channel resistance that is a function of the on-off state of two gates and a function the magnitude of the respective voltages on two gates. In short, the device becomes a voltage controlled resistor with the possibility for greater flexibility and control.

The resulting devices 10, 11, 13 and 15 have several advantages. One advantage is that each device presented is a SOI structure having a channel separated from the substrate 12 and therefore separated from other channel regions and other source and drain regions and therefore has less isolation related problems such as latch-up. The channel is made with a thin vertical width and isolated and therefore reduces many unwanted short channel effects. The germanium-silicon layer 18 which functions as a source and drain can electricallly activate dopant charge at a much lower temperature than other materials, such as polysilicon. This lower temperature keeps junctions, which are regions of high density dopant charge located within the substrate 12, and other dopant charge from diffusing outward to the point of electrically short circuiting. Lower temperature processing has been used to help avoid poor isolation resulting in higher leakage current and reduced product lifetime. Lowe temperature processing also reduces impurity transfer into the channel region which can shift FET performance, especially the threshold voltage, drastically. Because the source and draim germanium-silicom layer 18 is made thick and since resistance is inversely proportional to area, conventional series resistance losses are reduced which is desirable. The resulting SOI FET taught herein is more readily manufactured because the channel region, formed by silicon layer 16, and the source and drain, formed by germanium-silicon layer 18, are created by deposition techniques and high selective etching. These techniques are more repeatable and consistent than most other practiced SOI channel and source drain forming techniques mentioned previously. The thicker source and drain germanium-silicon layer 18 also provides better support for contact metallurgy. In general, the inventive process provides an SOI FET with improved performance and reliability.

While the present invention has been illustrated and described with reference to specific embodiments and procedures, further modifications and improvements will occure to those skilled in the art. For example, dielectric layers can be made from several different materials such as thermal oxide growth of silicon dioxide, nitride, tetra-ethyl-ortho-silicate (TEOS) and borophosphate-silicate-glass (BPSG). Semiconductor layers can be made from polysilicon, germanium-silicon, epitaxial silicon growth and deposited silicon. In addition, the described materials can be formed and removed in many ways such as deposition, growth, ion bombardment, plasma etch, wet solution etch and many other methods. Other known technology can be combined with this structure process to gain other advantages. An example of such a combination is the use of spacers on the sidewall of the source and drain formed by germanium-silicon layer 18 can be used to reduce Miller Capacitance by increasing the thickness of dielectric layer 28 between the germanium-silicon layer 18 and the gate 26. It is to be understood, therefore, that this invention is not limited to the particular forms shown and that it is intended in the appended claims to cover all modifications that do not depart from the spirit and scope of this invention.

I claim:

1. A process for fabricating a silicon on insulator FET comprising the steps of:
   providing a semiconductor substrate;
   forming a first dielectric layer overlying the substrate;
   forming a silicon layer of a first conductivity type overlying the first dielectric layer;
   forming a germanium-silicon layer of a second conductivity type overlying the silicon layer; and
   selectively etching a portion of the germanium-silicon layer relative to the silicon layer to form an opening, having a wall surface, and exposing a portion of the silicon layer, wherein the exposed portion of the silicon layer forms a transistor channel region and the unetched portion of the germanium-silicon layer forms the current electrodes.

2. The process of claim 1 further comprising the steps of forming a gate electrode of a predetermined conductivity in the substrate and aligned with the opening in the germanium-silicon layer.

3. The process of claim 2 further comprising the steps of:
   forming a second dielectric layer on the exposed portion of the silicon layer and the wall surface of the germanium-silicon layer; and
   forming a gate electrode overlying the second dielectric layer.

4. The process of claim 3 further comprising the step of forming a gate electrode wherein the gate electrode comprises a conductive region that completely fills the opening in the germanium-silicon layer and is bounded in the opening by the second dielectric region, and the gate electrode overlies partially the source and drain electrodes which are separated from the gate electrode by a dielectric layer.

5. The process of claim 1 further comprising the steps of:
   forming a second dielectric layer on the exposed portion of the silicon layer and the wall surface of the germanium-silicon layer; and
   forming a gate electrode overlying the second dielectric layer.

6. The process of claim 1 wherein the step of selectively etching a portion of the germanium-silicon layer comprises chemical etching with a solution containing HF, H2O2 and CH3COOH mixed in quantities of (1:2:3) respectively.

7. The process of claim 1 further comprising the steps of:
   forming of a nitride layer overlying the germanium silicon layer;
   forming a photoresist pattern on the nitride layer; and
   selectively etching the nitride layer using the photoresist pattern as an etch mask.

8. The process of claim 1 further comprising the step of forming a gate electrode wherein the gate electrode comprises a channel region extending from the first delectric layer into the substrate and is laterally coextensive with the wall surface of the opening in the germanium-silicon layer.

9. A process for fabricating a silicon on insulator FET comprising the steps of:
   providing a semiconductor substrate;
   forming a first dielectric layer overlying the substrate;
   forming a silicon layer of a first conductivity type overlying the first dielectric layer;
   forming a germanium-silicon layer of a second conductivity type overlying the silicon layer;
   forming a nitride layer overlying the germanium-silicon layer;
   selectively etching a portion of the germanium-silicon layer relative to the silicon layer to form an opening having a wall surface and exposing a portion of the silicon layer, wherein the exposed portion of the silicon layer forms a transistor channel region and the unetched portion of the germanium-silicon layer forms the source and drain electrodes; and
   forming a gate electrode in the substrate underlying the first dielectric layer and aligned to the opening in the germanium-silicon layer.

10. A process for fabricating a silicon on insulator FET comprising the steps of:
    providing a silicon substrate;
    growing a first silicon dioxide layer overlying the substrate;
    depositing a silicon layer of a first conductivity type overlying the first silicon dioxide layer;
    depositing a germanium-silicon layer of a second conductivity type overlying the silicon layer;
    depositing a nitride layer overlying the germanium-silicon layer;
    spinning a photoresist layer overlying the nitride layer forming a resist mask;
    selectively etching a portion of the germanium-silicon layer relative to the silicon layer with a solution containing HF, H2O2 and CH3COOH mixed in quantities of (1:2:3) respectively, and using the photoresist layer as an etch mask to form an opening having a wall surface and exposing a portion of the silicon layer, wherein the exposed portion of the silicon layer forms a transistor channel region and the unetched portion of the germanium-silicon layer forms the source and drain electrodes; and
    implanting dopant charge into the substrate to form a gate electrode underlying the first dielectric layer and aligned within the substrate by the opening in the germanium-silicon layer.

* * * * *